US012624450B2

(12) United States Patent
Chatelain et al.

(10) Patent No.: US 12,624,450 B2
(45) Date of Patent: May 12, 2026

(54) METHODS FOR FORMING AND UTILIZING ANTIMONY CONTAINING FILMS, AND RELATED STRUCTURES

(71) Applicant: ASM IP Holding B.V., Almere (NL)

(72) Inventors: Paul Chatelain, Tokyo (JP); Arpita Saha, Cardiff (GB); David Kurt de Roest, Leuven (BE); Yoann Tomczak, Leuven (BE); Charles Dezelah, Helsinki (FI); Daniele Piumi, Etterbeek (BE)

(73) Assignee: ASM IP Holding B.V., Almere (NL)

( * ) Notice: Subject to any disclaimer, the term of this patent is extended or adjusted under 35 U.S.C. 154(b) by 26 days.

(21) Appl. No.: 18/398,894

(22) Filed: Dec. 28, 2023

(65) Prior Publication Data

US 2024/0218510 A1      Jul. 4, 2024

Related U.S. Application Data

(60) Provisional application No. 63/478,016, filed on Dec. 30, 2022.

(51) Int. Cl.
*C23C 16/455* (2006.01)
*C23C 16/18* (2006.01)
*C23C 16/56* (2006.01)

(52) U.S. Cl.
CPC ........ *C23C 16/45542* (2013.01); *C23C 16/18* (2013.01); *C23C 16/45553* (2013.01); *C23C 16/56* (2013.01)

(58) Field of Classification Search
None
See application file for complete search history.

(56) References Cited

U.S. PATENT DOCUMENTS

| | | | |
|---|---|---|---|
| 9,006,112 B2 | 4/2015 | Matero | |
| 2007/0054475 A1* | 3/2007 | Lee | H10N 70/023 438/483 |
| 2014/0141542 A1* | 5/2014 | Kang | H01L 22/20 438/761 |

OTHER PUBLICATIONS

Atomic Layer Deposition of Antimony and its Compounds Using Dechlorosilylation Reactions of Tris(triethylsilyl) antimony, V. Pore et al., Chem. Mater. 2011, 23, 2, 247-254, Publication Date: Dec. 17, 2010, https://doi.org/10.1021/cm102904f.
Encyclopedia of (MO) CVD and ALD precursors, Antimony Precursors—www.mocvd-precursor-encyclopedia.de.
Tris(DiMethylAmido) Antimony, Sb[(CH3)2N]3, TDMASb, CAS# 7289-92-1.

* cited by examiner

*Primary Examiner* — Joshua L Allen
*Assistant Examiner* — Bradford M Gates
(74) *Attorney, Agent, or Firm* — Banner & Witcoff, Ltd.

(57) ABSTRACT

Systems and methods for forming an antimony containing film on a substrate. Related structures and films are also disclosed. The antimony films are be formed by a plasma enhanced atomic layer deposition process. The antimony films can be utilized as underlayers in EUV lithography processes.

15 Claims, 5 Drawing Sheets

<u>400</u>

200

202

Contacting the substrate with an antimony precursor

204

Contacting the substrate with one or more reactive species generated from a plasma pulse

206

End criterion reached?

208

End of the PEALD process

<u>400</u>

200 — Despositing an antimony containing film by a PEALD process

402 — Forming a EUV responsive layer over the antimony containing film

404 — Irradiating the EUV responsive layer and the antimony containing film with EUV radiation 406 — Developing the EUV responsive layer

METHODS FOR FORMING AND UTILIZING ANTIMONY CONTAINING FILMS, AND RELATED STRUCTURES

CROSS-REFERENCE TO RELATED APPLICATION(S)

This application claims the benefit of U.S. Provisional Application 63/478,016 filed on Dec. 30, 2022, the entire contents of which are incorporated herein by reference.

FIELD OF INVENTION

The present disclosure relates generally to the field of semiconductor processing methods and systems, and to the field of device and integrated circuit manufacture. More particularly, the present disclosure relates to methods for forming and utilizing antimony containing films, as well as structures including such antimony containing films.

BACKGROUND OF THE DISCLOSURE

Antimony (Sb) containing films have been utilized in a number semiconductor technology applications, including, but not limited to, non-volatile phase change memory, optical detectors, high-speed digital circuits, and quantum well structures. However, the wider adoption of antimony (Sb) containing films in semiconductor device structures and integrated circuits has been limited due to a number of factors, including, but not limited to, an inability to deposit films with a controlled composition, an insufficient deposition rate, and poor deposition quality at low temperatures. Accordingly, improved methods for depositing antimony containing films are desirable, as well as methods for utilizing said improved antimony containing films.

Any discussion, including discussion of problems and solutions, set forth in this section has been included in this disclosure solely for the purpose of providing a context for the present disclosure. Such discussion should not be taken as an admission that any or all of the invention was previously known or otherwise constitutes prior ar.

SUMMARY OF THE DISCLOSURE

This summary is provided to introduce a selection of concepts in a simplified form. These concepts are described in further detail in the detailed description of example embodiments of the disclosure below. This summary is not intended to identify key features or essential features of the claimed subject matter, nor is it intended to be used to limit the scope of the claimed subject matter.

In particular, the present disclosure describes methods for forming and utilizing an antimony containing film, the methods comprising, seating a substrate in a reaction chamber, and depositing an antimony containing film on the substrate by performing one or more unit deposition cycles of a plasma enhanced atomic layer deposition (PEALD) process, wherein a unit deposition cycle comprises, contacting the substrate with a vapor phase reactant comprising an antimony precursor, and contacting the substrate with one or more reactive species generated from a plasma produced from a gas comprising at least one of, argon (Ar), hydrogen (H2), helium (He), and mixtures thereof, wherein the deposited antimony containing film has a composition including metallic antimony (Sb).

In some embodiment, the antimony precursor comprises an alkylamine antimony precursor.

In some embodiment, the alkylamine antimony precursor comprises tris(dimethylamine)antimony (Sb(NMe$_2$)$_3$).

In some embodiment, the methods of the current disclosure further include, heating the substrate to a deposition temperature of less than 100° C.

In some embodiment, the methods of the current disclosure further include, applying an RF power of less than 50 Watts to generate the plasma.

In some embodiment, the methods of the current disclosure further include, tuning the composition of the antimony containing film by adjusting at least one of the composition, the flow rate, and flow rate ratio, of the gas employed in the generation of the plasma.

In some embodiment, the plasma is produced from a gas consisting essentially of argon (Ar), and hydrogen (H2).

In some embodiment, the deposited antimony containing film comprises, a surface composition (atomic-%) of metallic antimony (Sb) between 5 atomic-% and 45 atomic-%.

In some embodiment, the deposited antimony containing film comprises, a surface composition (atomic-%) of carbon (C) between 5 atomic-% and 30 atomic-%, and a surface composition of oxygen (O) between 20 atomic-% and 55 atomic-%.

In some embodiment, the plasma pulse is produced from a gas consisting essentially of helium (He).

In some embodiment, the deposited antimony containing film comprises, a bulk composition (atomic-%) of metallic antimony (Sb) greater than 90 atomic-%, and a surface composition comprising an antimony oxide (SbOx).

In some embodiment, the methods of the present disclosure can further include, forming an extreme ultraviolet (EUV) responsive layer over the antimony containing film, irradiating the EUV responsive layer and the underlying antimony containing film with EUV radiation, thereby generating a plurality of secondary electrons from the antimony containing film, wherein a portion of said secondary electrons are absorbed in the EUV responsive layer. The methods of the present disclosure can further include, developing the EUV responsive layer.

The present disclosure also includes methods for forming and utilizing an metallic antimony containing film, the methods comprising, depositing a metallic antimony containing film on a substrate by alternately and sequentially contacting the substrate with an alkylamine antimony precursor, and one or more plasma generated reactive species produced from a gas comprising, argon (Ar), hydrogen (H2), helium (He), and mixtures thereof. The methods of the present disclosure can also include, forming an ultraviolet (EUV) responsive layer over the metallic antimony containing film, irradiating select areas of the EUV responsive layer and the underlying metallic antimony containing film with EUV radiation thereby generating a plurality of secondary electrons from the metallic antimony containing film. The methods of the present disclosure can also include, developing the EUV responsive layer.

In some embodiment, the alkylamine antimony precursor comprises tris(dimethylamine)antimony (Sb(NMe2)3).

In some embodiment, the plasma is produced from a gas consisting essentially of argon (Ar), and hydrogen (H2), and the metallic antimony containing film comprises a surface composition (atomic-%) of metallic antimony (Sb) between 5 atom-% and 45 atomic-%.

In some embodiment, the plasma is produced from a gas consisting essentially of helium (He), and the metallic antimony containing film comprises a bulk composition (atomic-%) of metallic antimony (Sb) greater than 90 atomic-%, and a surface composition comprising, an antimony oxide (SbOx).

The present disclosure also includes structures comprises, a substrate, a metallic antimony containing film disposed over the substrate, and an ultraviolet (EUV) responsive layer disposed directly over the metallic antimony containing film.

In some embodiment, the metallic antimony containing film comprises, a surface composition (atomic-%) of metallic antimony (Sb) between 5 atom-% and 45 atomic-%.

In some embodiment, the metallic antimony containing film comprise, a bulk composition (atomic-%) of metallic antimony (Sb) greater than 90 atomic-%, and a surface composition comprising an antimony oxide (SbOx).

The present disclosure also includes structures comprising, a metallic antimony containing film deposited according to the methods disclosed herein, and a EUV responsive layer disposed directly over the metallic antimony containing film.

For purposes of summarizing the invention and the advantages achieved over the prior art, certain objects and advantages of the invention have been described herein above. Of course, it is to be understood that not necessarily all such objects or advantages may be achieved in accordance with any particular embodiment of the invention. Thus, for example, those skilled in the art will recognize that the invention may be embodied or carried out in a manner that achieves or optimizes one advantage or group of advantages as taught or suggested herein without necessarily achieving other objects or advantages as may be taught or suggested herein.

All of these embodiments are intended to be within the scope of the invention herein disclosed. These and other embodiments will become readily apparent to those skilled in the art from the following detailed description of certain embodiments having reference to the attached figures, the invention not being limited to any particular embodiment(s) disclosed.

BRIEF DESCRIPTION OF THE DRAWING FIGURES

While the specification concludes with claims particularly pointing out and distinctly claiming what are regarded as embodiments of the invention, the advantages of embodiments of the disclosure may be more readily ascertained from the description of certain examples of the embodiments of the disclosure when read in conjunction with the accompanying drawings, in which:

4

Figure 5:
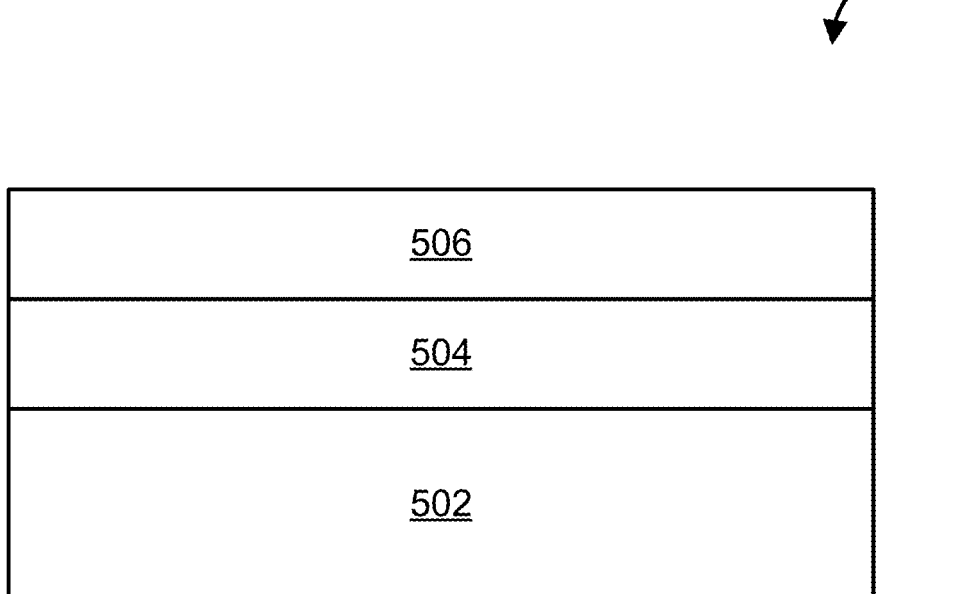

FIG. 5 illustrates a simplified cross-sectional view of a structure formed in accordance with at least one embodiment of the present disclosure.

It will be appreciated that elements in the figures are illustrated for simplicity and clarity and have not necessarily been drawn to scale. For example, the dimensions of some of the elements in the figures may be exaggerated relative to other elements to help improve understanding of illustrated embodiments of the present disclosure.

DETAILED DESCRIPTION OF EXEMPLARY EMBODIMENTS

The description of exemplary embodiments of methods, structures, devices and systems provided below is merely exemplary and is intended for purposes of illustration only; the following description is not intended to limit the scope of the disclosure or the claims. Moreover, recitation of multiple embodiments having stated features is not intended to exclude other embodiments having additional features or other embodiments incorporating different combinations of the stated features. For example, various embodiments are set forth as exemplary embodiments and may be recited in the dependent claims. Unless otherwise noted, the exemplary embodiments or components thereof may be combined or may be applied separate from each other.

As used herein, the term "gas" can include material that is a gas at normal temperature and pressure (NTP), a vaporized solid and/or a vaporized liquid, and can be constituted by a single gas or a mixture of gases, depending on the context. A gas other than the process gas, i.e., a gas introduced without passing through a gas distribution assembly, a multi-port injection system, other gas distribution device, or the like, can be used for, e.g., sealing the reaction space, and can include a seal gas, such as a rare gas. The terms "rare gas" and "noble gas" as used herein may be used interchangeably. In some cases, the term "precursor" can refer to a compound that participates in the chemical reaction that produces another compound, and particularly to a compound that constitutes a film matrix or a main skeleton of a film; the term "reactant" may be used interchangeably with the term precursor.

As used herein, the term "plasma enhanced atomic layer deposition" (PEALD) may refer to a vapor deposition process in which deposition cycles, preferably a plurality of consecutive deposition cycles, are conducted in a reaction chamber. Typically, during each unit deposition cycle a precursor is chemisorbed to a deposition surface (e.g., a substrate surface or a previously deposited underlying surface such as material from a previous PEALD cycle), forming a monolayer or sub-monolayer that does not readily react with additional precursor (i.e., a self-limiting reaction). Thereafter, reactive species generated by a plasma produced a gas may subsequently be introduced into or generated in the process chamber for use in converting the chemisorbed precursor to the desired material on the deposition surface. Further, purging steps may also be utilized during each unit deposition cycle to remove excess precursor, reactive species, and/or reaction byproducts from the process chamber.

As used herein, the term "reactive species" may refer to one or more species generated by the plasma excitation of a gas (including gas mixtures) and may include, but is not limited to, ions, radicals, and excited species.

As used herein, the term "substrate" can refer to any underlying material or materials that can be used to form, or upon which, a device, a circuit, or a film can be formed by means of a method according to an embodiment of the present disclosure. A substrate can include a bulk material, such as silicon (e.g., single-crystal silicon), other Group IV materials, such as germanium, or other semiconductor materials, such as Group II-VI or Group III-V semiconductor materials, and can include one or more layers overlying or underlying the bulk material. Further, the substrate can include various features, such as recesses, protrusions, and the like formed within or on at least a portion of a layer of the substrate. By way of example, a substrate can include bulk semiconductor material and an insulating or dielectric material layer overlying at least a portion of the bulk semiconductor material. Further, the term "substrate" may refer to any underlying material or materials that may be used, or upon which, a device, a circuit, or a film may be formed. The "substrate" may be continuous or non-continuous; rigid or flexible; solid or porous. The "substrate" may be in any form such as a powder, a plate, or a workpiece. Substrates in the form of a plate may include wafers in various shapes and sizes. Substrates may be made from materials, such as silicon, silicon germanium, silicon oxide, gallium arsenide, gallium nitride and silicon carbide for example. A continuous substrate may extend beyond the bounds of a process chamber where a deposition process occurs and may move through the process chamber such that the process continues until the end of the substrate is reached. A continuous substrate may be supplied from a continuous substrate feeding system allowing for manufacture and output of the continuous substrate in any appropriate form. Non-limiting examples of a continuous substrate may include a sheet, a non-woven film, a roll, a foil, a web, a flexible material, a bundle of continuous filaments or fibers (i.e., ceramic fibers or polymer fibers). Continuous substrates may also comprise carriers or sheets upon which non-continuous substrates are mounted.

As used herein, the term "film" and/or "layer" can refer to any continuous or non-continuous structure and material, such as material deposited by the methods disclosed herein. For example, film and/or layer can include two-dimensional materials, three-dimensional materials, nanoparticles or even partial or full molecular layers or partial or full atomic layers or clusters of atoms and/or molecules. A film or layer may comprise material or a layer with pinholes, which may be at least partially continuous.

As used herein, the term "EUV responsive" may refer to a material, film, or layer, which when irradiated with extreme ultraviolet (EUV) radiation may absorb at least a portion of the EUV radiation and undergo at least one of a physical or chemical alteration in response to the EUV radiation.

As used herein, "EUV radiation" may refer and encompass electromagnetic radiation in both the UV and the EUV wavelength ranges, and at lower wavelength can encompass wavelengths approaching and including soft x-ray wavelengths. For example EUV radiation can refer to electromagnetic radiation having a wavelength of less than 400 nanometers, or less than 300 nanometers, or less than 250 nanometers, or less than 200 nanometers, or less than 100 nanometers, or less than 50 nanometers, or less than 25 nanometers, or less than 20 nanometers, or less than 10 nanometers, or less than 5 nanometers, or with a wavelength between approximately 10 nanometers and approximately 400 nanometers, or with a wavelength between approximately 10 nanometers and approximately 200 nanometers, or within a wavelength between approximately 1 nanometers and 10 nanometers. In some embodiments the electromagnetic radiation may be in the range below 13.5 nanometers. As non-limiting examples, the EUV radiation may have a wavelength of 193 nanometers, 248 nanometers, 13.5 nanometers.

As used herein, the term "structure" can be or include a substrate as described herein and can also include one or more layers (i.e., films) overlying the substrate, such as one or more layers formed according to a method according to the disclosure.

As used herein, the term "antimony containing film" can refer to a film which contains antimony (Sb) in any form within said film. As a non-limiting example, an "antimony containing film" can include antimony in its elemental form, as well as antimony in compound form, including, but not limited to, antimony oxides, antimony hydroxides, antimony nitrides, and antimony carbides. Antimony in its elemental form can form as a metal, or as a metastable form, such as black or yellow antimony, or as an amorphous material.

As used herein, the term "metallic antimony containing film" can refer to a film which comprises antimony (Sb) in its elemental metallic form.

As used herein, the term "metallic" can refer to metal, a metalloid, or semimetal. Likewise, a "metallic containing film" or a "a metallic composition" can refer to film that includes metal elements, metalloid elements, and semimetal elements. The term "metallic", "metal", "metalloid", and "semimetal" can be used interchangeably within the context of the present disclosure.

As used herein, the term "surface composition" can refer to the composition of a material, where a surface in the context of the present application can refer to the upper most 1 nanometer (nm) to 10 nm of the material, depending on the surface analysis technique employed in determining the surface composition. For example, the surface composition can be determined by x-ray photoelectron spectroscopy (XPS) which typically has a measurement penetration depth between 1 nm and 10 nm depending on the measurement parameters.

As used herein, the term "bulk composition" can refer to the composition of the bulk (or majority) of the thickness of the material film or layer.

As used herein, the term "comprising" indicates that certain features are included, but that it does not exclude the presence of other features, as long as they do not render the claim unworkable. In some embodiments, the term "comprising" includes "consisting."

As used herein, the term "consisting" indicates that no further features are present in the apparatus/method/product apart from the ones following said wording. When the term "consisting" is used referring to a chemical compound, substance, or composition of matter, it indicates that the chemical compound, substance, or composition of matter only contains the components which are listed. Likewise, when the term "consisting essentially" is used referring to a chemical compound, substance, or composition of matter, it indicates that the chemical compound, substance, or composition of matter contains the components which are listed but can also containing trace elements and/or impurities that do not materially affect the characteristics of said chemical compound, substrate, or composition of matter. This notwithstanding, the chemical compound, substance, or composition of matter may, in some embodiments, comprise other components as trace elements or impurities, apart from the components that are listed.

Further, in this disclosure, any two numbers of a variable can constitute a workable range of the variable, and any ranges indicated may include or exclude the endpoints. Additionally, any values of variables indicated (regardless of whether they are indicated with "about" or not) may refer to precise values or approximate values and include equivalents, and may refer to average, median, representative, majority, or the like. Further, in this disclosure, the terms "including," "constituted by" and "having" refer independently to "typically or broadly comprising," "comprising," "consisting essentially of," or "consisting of" in some embodiments. In this disclosure, any defined meanings do not necessarily exclude ordinary and customary meanings in some embodiments.

When specific process conditions are provided in this disclosure, they are provided for a reaction chamber volume of 1 liter and for 300 mm wafers. The skilled person understands that these values can be readily extended to other reaction chamber volumes and wafer sizes.

The embodiments of the present disclosure include methods for forming antimony containing films by plasma enhanced atomic layer deposition (PEALD) processes and particularly methods for depositing antimony containing films by PEALD processes which have a composition including metallic antimony (Sb).

The embodiments of the present disclosure can also include methods for utilizing the antimony containing films depositing by the novel PEALD processes described herein. For example, in some embodiments, an antimony containing film formed by the methods disclosure herein, can be utilized as underlayer, disposed beneath a EUV responsive layer, to enable a reduction in the EUV dose required to expose said EUV responsive layer.

For example, extreme ultraviolet lithography (EUVL) can utilize organic polymer EUV responsive photoresist materials. The EUVL process may expose the EUV responsive photoresist to EUV radiation which is at least partially absorbed in the organic EUV photoresist and also in an antimony containing underlayer (formed by the methods disclosed herein) disposed between the EUV responsive layer and a substrate. The antimony containing underlayer can produce a plurality of secondary electrons when exposed to EUV radiation. The secondary electron produced by the underlayer can increase chemical reactions in the EUV responsive layer thereby increasing the sensitivity of said EUV responsive layer which in turn can reduce the dose required to expose the EUV responsive layer.

In addition, the embodiments of the present disclosure enable the tuning of the composition of the deposited antimony containing films, both for the surface composition and the bulk composition. Therefore, the composition of the antimony containing films can be tuned and thereby optimized to most efficiently reduce the dose of EUV radiation required in a multitude of different EUV responsive layers comprising differing materials/compositions.

Therefore, in some embodiments of the disclosure, plasma enhanced atomic layer deposition (PEALD) processes can be used to deposit antimony containing films. Briefly, a substrate or a workpiece is seated in a reaction chamber and subjected to alternatively repeated surface reactions. In some embodiments, antimony containing films are formed by repetition of self-limiting PEALD cycles. In some embodiments, each PEALD unit deposition cycle comprises at least two distinct phases. The prevision and removal of a reactant from the reaction chamber may be considered a phase.

In a first phase, a vapor phase reactant comprising an antimony precursor can be introduced into the reaction chamber and contacts the substrate therein, wherein the antimony precursor may form no more than about one monolayer on the substrate surface. This reactant is also referred to herein as the "antimony precursor", "antimony-containing precursor", and may be, for example, comprise an alkylamine antimony precursor.

In a second phase, a second reactant comprising one or more reactive species is introduced into the reaction chamber, or is generated within the reaction chamber, and contacts the substrate therein, wherein the one or more reactive species can convert the absorbed antimony precursor to an antimony containing film. In some embodiments of the disclosure, the second reactant may comprise one or more reactive species generated from a plasma produced from a gas comprising at least one of, argon (Ar), hydrogen (H2), helium (He), and mixtures thereof.

As previously stated, the PEALD processes of the present may form antimony containing films by performing one or more repetitions of a unit deposition cycle, wherein a unit deposition cycle may include the generation of reactive species from a plasma. As a non-limiting example, the deposition cycles may be performed using suitable apparatus such as the exemplary apparatus 100 illustrated in FIG. 1.

Figure 1:
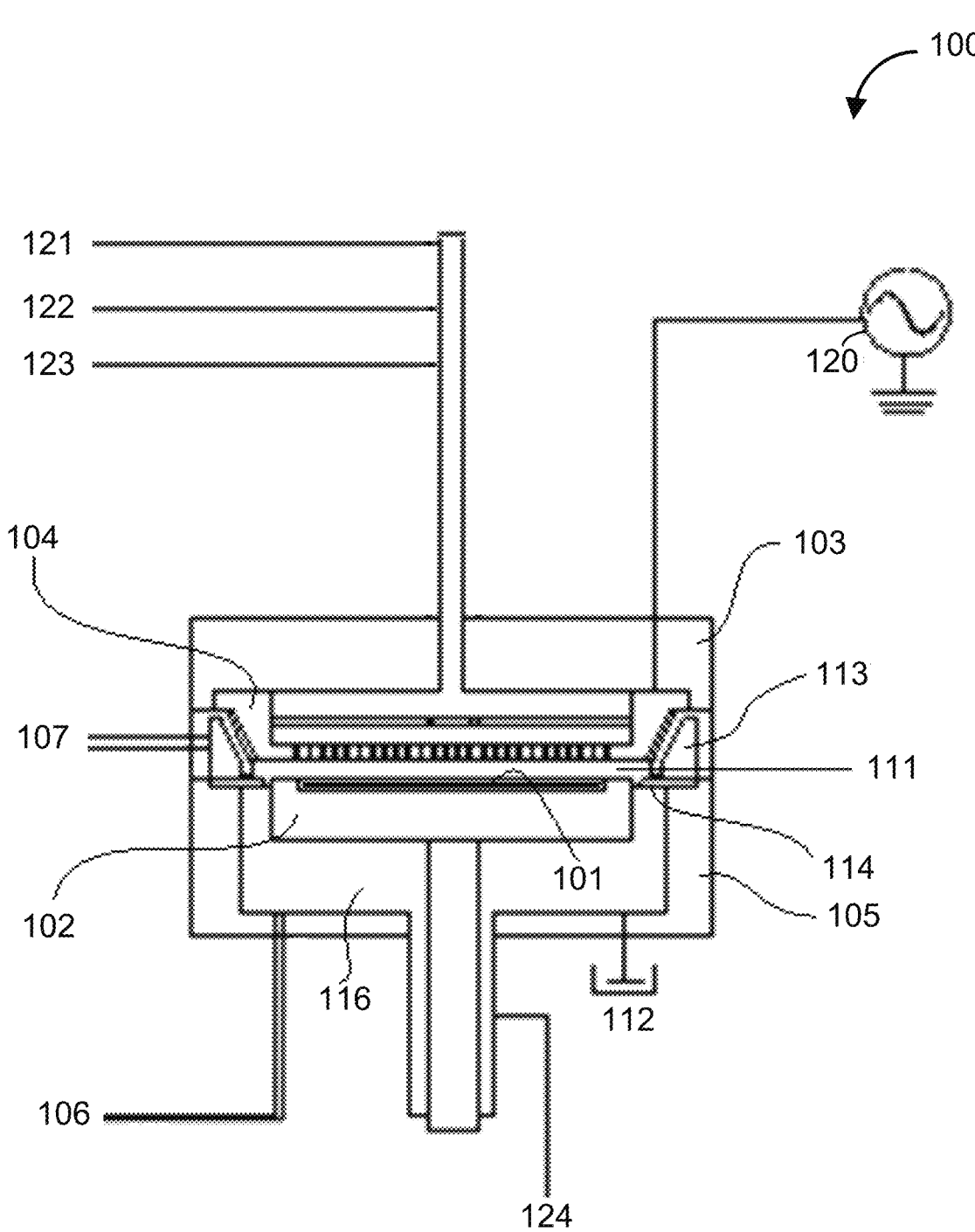
FIG. 1 illustrates a simplified schematic representation of a plasma-enhanced atomic layer deposition (PEALD) apparatus suitable for depositing an antimony containing film in accordance with at least one embodiment of the present disclosure.

In more detail, FIG. 1 is a schematic view of an exemplary PEALD apparatus 100, desirably in conjunction with controls programmed to conduct the sequences described below, usable in some embodiments of the present invention. In FIG. 1, by providing a pair of electrically conductive flat-plate electrodes 104 and 102 in parallel and facing each other in the interior 111 (reaction zone) of a reaction chamber 103, applying RF power (e.g., 13.56 MHz, or 27 MHz, or 54 MHz, or 108 MHZ) 120 to one side, and electrically grounding the other side 112, a plasma is excited between the electrodes. A temperature regulator is provided in a lower stage 102 (the lower electrode), and a temperature of a substrate 101 placed thereon is kept constant at a given deposition temperature. The upper electrode 104 serves as a shower head plate as well, and reactant gas and precursor gas are introduced into the reaction chamber 103 through a gas line 121 and a gas line 122, respectively, and through the shower head plate 104.

Additionally, in the reaction chamber 103, a circular duct 113 with an exhaust line 107 is provided, through which gas in the interior 111 of the reaction chamber 103 is exhausted. Additionally, a dilution gas is introduced into the reaction chamber 103 through a gas line 123. Further, a transfer chamber 105 disposed below the reaction chamber 103 is provided with a seal gas line 124 to introduce seal gas into the interior 111 of the reaction chamber 103 via the interior 116 (transfer zone) of the transfer chamber 105 wherein a separation plate 114 for separating the reaction zone and the transfer zone is provided (a gate valve through which a wafer is transferred into or from the transfer chamber 105 is omitted from this figure). The transfer chamber is also provided with an exhaust line 106.

Figure 2:
FIG. 2 illustrates an exemplary method for depositing an antimony containing film in accordance with at least one embodiment of the present disclosure.

An exemplary method 200 for depositing an antimony film utilizing plasma enhanced atomic layer deposition processes is illustrated with reference to FIG. 2. The exemplary method 200 may comprise two phases, a first phase comprising, contacting the substrate with a antimony precursor (step 202), and a second phase comprising contacting the substrate with one or more reactive species generated from a plasma (step 204).

In more detail, the exemplary method 200 may commence by seating a substrate in a suitable reaction chamber, such as the reaction chamber of exemplary PEALD apparatus 100 of FIG. 1. Once the substrate is disposed within the reaction chamber, the substrate may be heated to a desired deposition temperature. For example, the substrate may be heated to a deposition temperature of less than approximately 300° C., or less than approximately 200° C., or less than approximately 100° C., or even less than approximately 50° C. In some embodiments of the disclosure, the deposition temperature may be greater than room temperature, between approximately 50° C. and approximately 300° C., or between approximately 75° C. and approximately 200° ° C., or between approximately 100° C. and approximately 150° C.

In addition to controlling the deposition temperature of the substrate, the pressure in the reaction chamber may also be regulated to enable deposition of an antimony containing film with desired properties. For example, in some embodiments of the disclosure, the pressure within the reaction chamber may be less than 760 Torr, or between 0.1 Torr and 10 Torr, or between 0.5 Torr and 5 Torr, or between 1 Torr to 4 Torr.

The exemplary method 200 (FIG. 2) may continue by introducing an antimony precursor into the reaction chamber and contacting the substrate with the antimony precursor (step 202). In some embodiments of the disclosure, the antimony (Sb) precursor may comprise an metalorganic antimony precursor which can include at least one of an antimony alkoxide, an antimony alkylamine, or an antimony alkyl.

In some embodiments, the antimony precursor can comprise an alkylamine antimony precursor. In such embodiments, the antimony precursor may comprise, for example, $Sb(NR_2)_xA_{3-x}$, wherein x is from 1 to 3, and each R can be independently selected to be linear, branched or cyclic, saturated or unsaturated, C1-C12 alkyl or alkenyl group or hydrogen if the other R is not hydrogen. In some embodiments the alkyl or alkenyl might also be substituted with substituents such as halogens, amines, silyls, for example. The A in $Sb(NR_2)_xA_{3-x}$ can comprise a ligand comprising alkylamine, halide, amine, silyl or alkyl. A specific example of an alkylamine antimony precursor is tris(dimethylamine) antimony, $Sb(NMe_2)_3$. Other non-limiting examples of alkylamine antimony precursor include, but are not limited to, C2-C3 variants: $Sb(NEt_2)_3$, $Sb(NPr_2)_3$ and $Sb(N^iPr_2)_3$. The R in $Sb(NR_2)_3$ can be linear or branched, cyclic or linear, saturated or unsaturated, C1-C12 alkyl or alkenyl group. The alkyl or alkenyl might also be substituted with substituents like halogens, amines, silyls etc.

In some embodiments, an antimony metalorganic precursor may comprise at least one of $Sb(N(CH_3)_2)_3$, $Sb(NMe_2)_3$, $Sb(NEr_2)_3$, or $Sb(NPr_2)_3$. Metalorganic antimony precursors are described in U.S. Pat. No. 9,006,112, issued to Matero et al., and incorporated by reference herein.

In some embodiments, the antimony precursor comprises an alkylamine antimony precursor. In some embodiments, the alkylamine precursor comprises, tris(dimethylamine) antimony $(Sb(NMe_2)_3)$.

In some embodiments, the antimony precursor may be pulsed into the reaction chamber for a time period from about 0.05 second to about 5.0 seconds, or from about 0.1 seconds to about 3 seconds, or even about 0.2 seconds to about 1.0 seconds. Unless otherwise noted, the term "pulse" does not restrict the length or duration of the pulse and a pulse may be any length of time. In addition, during the contacting of the substrate with the antimony precursor, the flow rate of the antimony precursor may be less than 200 sccm, or less than 100 sccm, or less than 50 sccm, or less than 10 sccm, or even less than 2 sccm. In addition, during the contacting of substrate with the antimony precursor the flow rate of the antimony precursor may range from about 2 to 10 sccm, from about 10 to 50 sccm, or from about 50 to about 200 sccm.

After sufficient time for at least a monolayer to adsorb on the substrate surface, excess antimony precursor may be removed from the reaction chamber. In some embodiments, the excess antimony precursor may be purged by stopping the flow of the antimony precursor while continuing to flow a carrier gas, a purge gas, or a gas mixture, for a sufficient time to diffuse or purge excess reactants and reactant by-products, if any, from the reaction chamber. In some embodiments, the excess antimony precursor may be purged with aid of one or more inert gases, such as nitrogen, helium or argon, that may be flowing throughout the PEALD method 200.

The exemplary method 200 may continue by, contacting the substrate with one or more reactive species generated from a plasma produced from a gas comprising at least one of, argon (Ar), hydrogen ($H_2$), helium (He), and mixtures thereof (step 204).

In some embodiments, the one or more reactive species generated from the plasma (also referred as the "plasma pulse") may contact the substrate for a time period between about 0.1 seconds to about 20 seconds, or about 0.5 seconds to about 10 seconds, or even about 0.5 seconds to about 5 seconds. In some embodiments, the reactive species generated from the plasma may contact the substrate for a time period of between approximately 0.5 seconds and 10 seconds.

In some embodiments, the plasma pulse can be generated employing an RF powered plasma in the reaction chamber. In some embodiments, a plasma power of at least 10 W to at most 500 W can be used to generate the plasma pulse. In some embodiments, a plasma power of at least 20 W to at most 150 W can be used to generate the plasma pulse. In some embodiments, a plasma power of at least 30 W to at most 100 W can be used to generate the plasma pulse. In some embodiments, a plasma power of at least 35 W to at most 75 W can be to generate the plasma pulse. In some embodiments, a plasma power of at least 40 W to at most 50 W can be used to generate the plasma pulse. In some embodiments, a plasma power of less than 100 W, or less than 80 W, or less than 60 W, or less than 50 W, or less than 40 W, or less than 30 W, or less than 20 W, or between 20 W and 100 W can be used to generate the plasma pulse.

In some embodiments, the method can be executed in a system comprising two electrodes between which the substrate is positioned. The electrodes can be positioned parallel at a pre-determined distance called an electrode gap. In some embodiments, the electrode gap can be at least 5 mm to at most 30 mm, at least 5 mm to at most 10 mm, or at least 10 mm to at most 20 mm, or of at least 20 mm to at most 30 mm.

In some embodiments, a plasma frequency of at least 40 kHz to at most 2.45 GHz can be used during the plasma pulses, or a plasma frequency of at least 40 kHz to at most 80 kHz can be used during the plasma pulses, or a plasma frequency of at least 80 kHz to at most 160 kHz can be used during the plasma pulses, or a plasma frequency of at least 160 kHz to at most 320 kHz can be used during the plasma pulses, or a plasma frequency of at least 320 kHz to at most 640 kHz can be used during the plasma pulses, or a plasma frequency of at least 640 kHz to at most 1280 kHz can be used during the plasma pulses, or a plasma frequency of at least 1280 kHz to at most 2500 kHz can be used during the plasma pulses, or a plasma frequency of at least 2.5 MHz to at least 5 MHz can be used during the plasma pulses, or a plasma frequency of at least 5 MHz to at most 50 MHz can be used during the plasma pulses, or a plasma frequency of at least 5 MHz to at most 10 MHz can be used during the plasma pulses, or a plasma frequency of at least 10 MHz to at most 20 MHz can be used during the plasma pulses, or a plasma frequency of at least 20 MHz to at most 30 MHz can be used during the plasma pulses, or a plasma frequency of at least 30 MHz to at most 40 MHz can be used during the plasma pulses, or a plasma frequency of at least 40 MHz to at most 50 MHz can be used during the plasma pulses, or a plasma frequency of at least 50 MHz to at most 100 MHz can be used during the plasma pulses, or a plasma frequency of at least 100 MHz to at most 200 MHz can be used during the plasma pulses, or a plasma frequency of at least 200 MHz to at most 500 MHz can be used during the plasma pulses, or a plasma frequency of at least 500 MHz to at most 1000 MHz can be used during the plasma pulses, or a plasma frequency of at least 1 GHz to at most 2.45 GHz can be used during the plasma pulses. In exemplary embodiments, the plasma can be an RF plasma, and RF power can be provided at a frequency of 13.56 MHz.

After a time period sufficient to react the previously absorbed antimony precursor with the one or more reactive species generated from the plasma pulse, any excess reactant and reaction byproducts may be removed from the reaction chamber. As with the removal of the antimony precursor, this step may comprise stopping generation of reactive species and continuing to flow an inert gas, such as a gas comprising nitrogen, helium, and in some embodiments additionally argon. The inert gas flow may flow for a time period sufficient for excess reactive species and volatile reaction byproducts to diffuse out of and be purged from the reaction chamber. For example, the purge process may be utilized for a time period between about 0.1 seconds to about 10 seconds, or about 0.1 seconds to about 4.0 seconds, or even about 0.1 seconds to about 0.5 seconds.

The exemplary method 200 wherein the substrate is alternately and sequentially contacted with the antimony precursor and contacted with the one or more reactive species generated from a gas comprising at least one of, argon, hydrogen, helium, and mixtures thereof may constitute a unit deposition cycle. In some embodiments of the disclosure, the exemplary PEALD process 200 may comprise, repeating the unit deposition cycle one or more times. For example, the exemplary PEALD process of exemplary method 200 may continue with a decision gate 206 which determines if the method 200 continues or is terminated. For example, the decision gate of step 206 can be determined based on reaching a predetermined end criterion. As non-limiting examples, the end criterion can be based on reaching a desired thickness of the antimony containing film, or by performing a predetermined number of deposition cycles. If the end criterion of decision gate 206 is not attained then the exemplary method 200 may return to step 202 and the processes of contacting the substrate with the antimony precursor (step 202) and contacting the substrate with the one or more reactive species (step 204) may be repeated one or more times. For example, in some embodiments, the exemplary method 200 may comprise, from at least 10 to at most 30000 deposition cycles, or from at least 10 to at most 3000 deposition cycles, or from at least 10 to at most 1000 deposition cycles, or from at least 10 to at most 500 deposition cycles, or from at least 20 to at most 200 deposition cycles, or from at least 50 to at most 150 deposition cycles, or from at least 75 to at most 125 deposition cycles, for example 100 deposition cycles.

In some embodiments of the disclosure, the unit deposition cycle of the exemplary PEALD process 200 may be repeated until an antimony containing film is deposited having an average film thickness, of less than 30 nm, or less 25 nm, or less than 20 nm, or less than 15 nm, or less than 10 nm, or less than 5 nm, or less than 2 nm, or between 2 and 30 nm, or between 5 and 25 nm, or between 10 and 20 nm. In some embodiments, the deposited antimony containing film may a thickness non-uniformity (NU %), of less 3 percent (%), or less than 2 percent (%), or less than 1 percent (%), or between 1 and 3 percent (%).

Once the end criterion of decision gate 206 has been attained, the exemplary method 200 may exit by means of an end of PEALD process step (step 208) and the antimony containing film may be subjected to additional processes as desired.

While the PEALD deposition cycle is generally referred to herein as beginning with the antimony phase, it is contemplated that in other embodiments the cycle may begin with the reactive species phase. One of skill in the art will recognize that the first precursor phase generally reacts with the termination left by the last phase in the previous cycle. Thus, while no reactant may be previously absorbed on the substrate surface or present in the reaction chamber if the reactive species is the first phase in the PEALD cycle, in subsequent cycles the reactive species phase will effectively follow the antimony phase. In some embodiments, one or more different PEALD cycles are provided in the deposition process.

Figure 3:
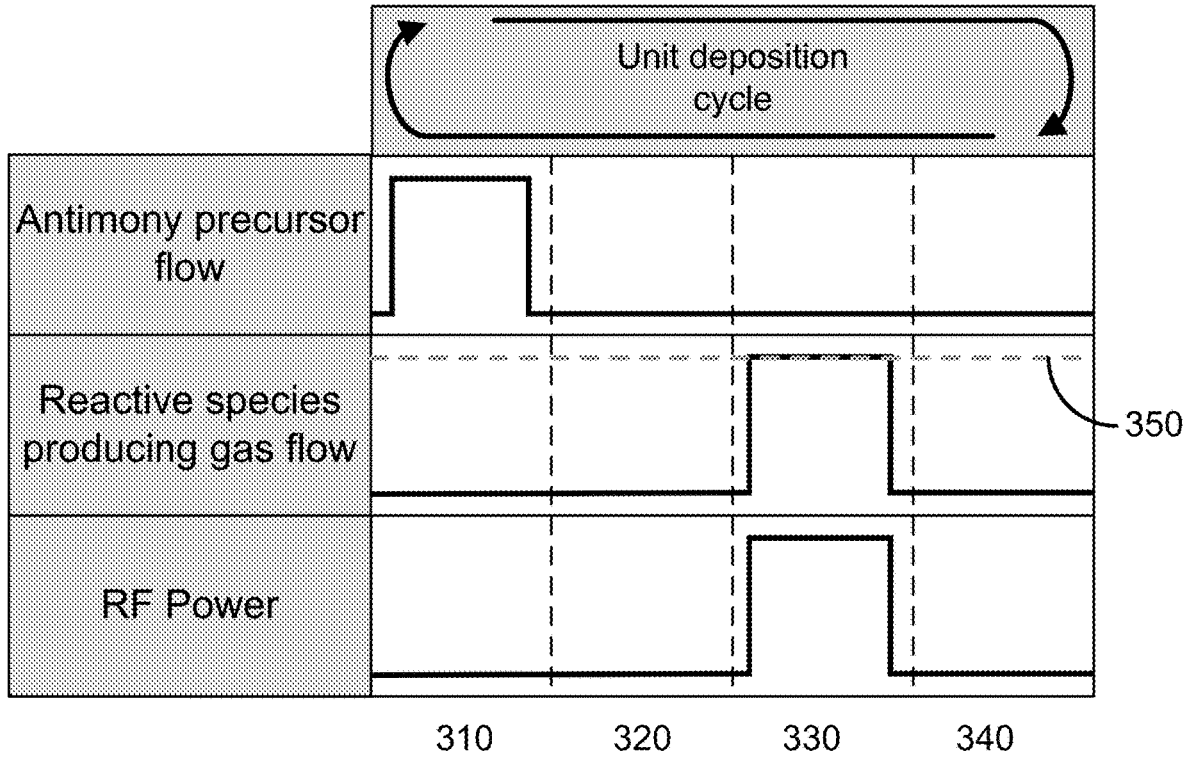
FIG. 3 illustrates an exemplary unit deposition cycle sequence for PEALD depositing an antimony containing film in accordance with at least one embodiment of the present disclosure.

A further overview of a non-limiting exemplary unit deposition cycle of the PEALD processes of the current disclosure is illustrated with reference to FIG. 3. As illustrated in FIG. 3, the horizontal axis represents the time parameter but does not necessarily represent the actual time length of individual processes, and the vertical axis represents an ON-state or OFF-state for gas flow and RF power, wherein a raised level on the vertical axis of each parameter represents an ON-state. However, the vertical axis of each line does not necessarily represent the actual quantity of the associated parameter, whereas a bottom level of each line on the vertical axis represents an OFF-state, i.e., zero gas flow, or no RF power supplied.

In brief, in a first period 310 (i.e., the precursor pulse period) of the unit deposition cycle the antimony precursor may be pulsed into the reaction chamber along with a flow of carrier gas/inert gas. In this first period 310, the antimony precursor can be introduced into the reaction chamber, contact the substrate, and chemisorb on the surface of the substrate forming at most a monolayer. In a second period 320 (i.e., a purge period) the flow of the antimony precursor is stopped and the flow of the carrier gas/inert gas can continue such that the reaction chamber is purged of excess antimony precursor and any by-products. In a third period 330 (i.e., the RF pulse period) the reactive species producing gas is introduced into the reaction chamber and a pulse of RF power is supplied to the gas to excite a plasma and generate the one or more reactive species which react with the chemisorbed antimony precursor thereby forming an antimony containing film. In some embodiments, the flow of reactive species producing gas flow may be allowed to stabilize for a period of time prior to applying the RF power to the plasma producing gas (not shown). In a fourth period 340 (i.e., a purge period) the RF power, antimony precursor flow, and reactive gas producing gas flow are in the OFF-state and a carrier gas/inert gas flow may continue thereby purging the reaction chamber of excess reactive species and any reaction by-products. In some embodiments, the reactive species producing gas may flow continuously throughout the deposition cycle (as shown by optionally dashed line 350) and in such embodiments the reactive species producing gas can act as both the gas for reactive species generation (when the RF power is applied) and can also act as a purge gas.

In some embodiments of the disclosure, the composition of the antimony containing film deposited by the PEALD processes of the present disclosure can be tuned to deposit an antimony containing film with a desired composition. For example, in some embodiments, tuning the composition of the antimony containing film may comprise, adjusting at least one of the composition, the flow rate, and the flow rate ratio, of the gas (and its various component gases if applicable) employed in the generation of the plasma.

For example, in some embodiments, the plasma (i.e., the plasma pulse) can be produced from a gas consisting of argon (Ar), and hydrogen ($H_2$). In some embodiments, the plasma can be produced from a gas consisting essentially of argon (Ar), and hydrogen ($H_2$). In such embodiments, the deposited antimony containing film can have a surface composition comprising, an atomic percentage (atomic-%) of metallic antimony (Sb) between 5 atomic-% and 100 atomic-%, or between 5 atomic-% and 80 atomic-%, or between 5 atomic-% and 70 atomic-%, between 5 atomic-% and 60 atomic-%, or between 5 atomic-% and 50 atomic-%, or between 5 atomic-% and 45 atomic-%, or between 5 atomic-% and 40 atomic-%, or between 5 atomic-% and 30 atomic-%, or between 5 atomic-% and 20 atomic-%, or even between 5 atomic-% and 10 atomic-%. In addition, in such embodiments, the deposited antimony containing film can comprise a surface composition comprising, an atomic percentage (atomic-%) of total antimony (Sb) (i.e., antimony in all forms) between 10 atomic-% and 100 atomic-%, or between 20 atomic-% and 80 atomic-%, or between 30 atomic-% and 70 atomic-%, between 40 atomic-% and 60 atomic-%, or even between 45 atomic-% and 55 atomic-%. In addition, in such embodiments, the deposited antimony containing film can comprise a surface composition comprising, an atomic percentage (atomic-%) of oxygen (O) between 5 atomic-% and 60 atomic-%, or between 5 atomic-% and 50 atomic-%, between 5 atomic-% and 40 atomic-%, or between 5 atomic-% and 30 atomic-%, or between 5 atomic-% and 30 atomic-%, or between 5 atomic-% and 20 atomic-%, or even between 5 atomic-% and 10 atomic-%. In addition, in such embodiments, the deposited antimony containing film can comprise a surface composition comprising, an atomic percentage (atomic-%) of carbon (C) between 0 atomic-% and 40 atomic-%, or between 0 atomic-% and 30 atomic-%, between 0 atomic-% and 20 atomic-%, or between 0 atomic-% and 10 atomic-%, or even between 0 atomic-% and 5 atomic-%. In addition, in such embodiments, the deposited antimony containing film can comprise a surface composition comprising, an atomic percentage (atomic-%) of nitrogen (N) between 0 atomic-% and 10 atomic-%, or between 0 atomic-% and 8 atomic-%, between 0 atomic-% and 6 atomic-%, or between 0 atomic-% and 4 atomic-%, or between 0 atomic-% and 2 atomic-%, or even between 0 atomic-% and 1 atomic-%. As used herein, the surface composition is determined by x-ray photoelectron spectroscopy (XPS) which typically has a measurement penetration depth between 1 nm and 10 nm depending on the measurement parameters.

In some embodiments, the plasma can be produced from a gas consisting of helium (He). In some embodiments, the plasma can be produced from a gas consisting essentially of helium (He). In such embodiments, the deposited antimony containing film can comprise a bulk composition comprising, an atomic percentage (atomic-%) of metallic antimony (Sb) between 5 atomic-% and 100 atomic-%, or between 5 atomic-% and 90 atomic-%, between 5 atomic-% and 80 atomic-%, or between 5 atomic-% and 70 atomic-%, or between 5 atomic-% and 60 atomic-%, or between 5 atomic-% and 50 atomic-%, or between 5 atomic-% and 40 atomic-%, or even between 5 atomic-% and 25 atomic-%. In addition, in such embodiments, the deposited antimony containing film can comprise a surface composition comprising, an antimony oxide ($SbO_x$). For example, in such embodiments, the surface composition of the deposited antimony containing film can comprise, an atomic percentage (atomic-%) of total antimony (Sb) (i.e., antimony in all forms) between 20 atomic-% and 40 atomic-%, or between 25 atomic-% and 35 atomic-%, between 25 atomic-% and 30 atomic-%. In addition, in such embodiments, the deposited antimony containing film can comprise a surface composition comprising, an atomic percentage (atomic-%) of oxygen (O) between 40 atomic-% and 60 atomic-%, or between 45 atomic-% and 58 atomic-%, or between 50 atomic-% and 56 atomic-%. In addition, in such embodiments, the deposited antimony containing film can comprise a surface composition comprising, an atomic percentage (atomic-%) of carbon (C) between 0 atomic-% and 40 atomic-%, or between 0 atomic-% and 30 atomic-%, between 0 atomic-% and 20 atomic-%, or between 0 atomic-% and 10 atomic-%, or even between 0 atomic-% and 5 atomic-%. In addition, in such embodiments, the deposited antimony containing film can comprise a surface composition comprising, an atomic percentage (atomic-%) of nitrogen (N) between 0 atomic-% and 10 atomic-%, or between 0 atomic-% and 8 atomic-%, between 0 atomic-% and 6 atomic-%, or between 0 atomic-% and 4 atomic-%, or between 0 atomic-% and 2 atomic-%, or even between 0 atomic-% and 1 atomic-%. In addition, in such embodiments, the surface composition of the deposited antimony containing film can comprise, an atomic percentage (atomic-%) of metallic antimony (Sb) between 0 atomic-% and 10 atomic-%, or between 0 atomic-% and 5 atomic-%, between 0 atomic-% and 1 atomic-%.

The embodiments of the present disclosure also include methods for utilizing the antimony containing films deposited by the methods disclosed herein. As previously described, the antimony containing films deposited according to the methods of the present disclosure may be employed as antimony containing underlayers, wherein the antimony containing underlayers can be disposed beneath a EUV responsive layer to enable a reduction in the EUV dose required to sufficiently expose said EUV responsive layer.

Therefore, the embodiments of the present disclosure can further comprise, forming an extreme ultraviolet (EUV) responsive layer over an antimony containing film, irradiating the EUV responsive layer and the underlying antimony containing film with EUV radiation, thereby generating a plurality of secondary electrons from the antimony containing film in response to the EUV irradiation, and absorbing a portion of the plurality of the secondary electrons in the EUV responsive layer. Upon providing a sufficient dose of EUV radiation (and secondary electrons) to the EUV response layer the EUV responsive layer can developed.

Figure 4:
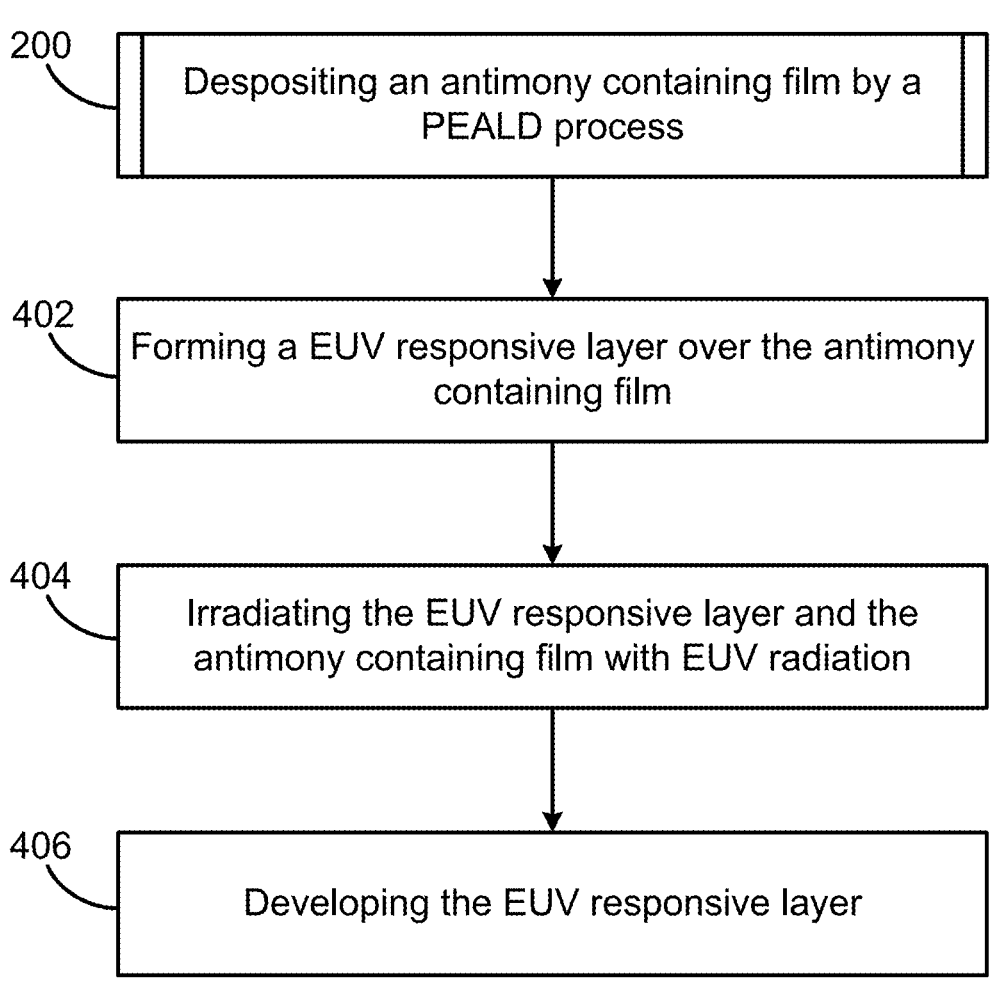
FIG. 4 illustrates an exemplary method for utilizing an antimony containing film as an underlayer for improving EUV patterning technologies in accordance with at least one embodiment of the present disclosure.

For example, FIG. 4 illustrated an exemplary method 400 which comprises depositing and utilizing the antimony containing film of the present disclosure in EUV lithography applications. In more detail, the exemplary method 400 may commence with step 200 (i.e., the exemplary method 200 of FIG. 2) which comprises, depositing a metallic antimony containing film on a substrate by alternately and sequentially contacting the substrate with an alkylamine antimony precursor, and one or more plasma generated reactive species produced from a gas comprising, argon (Ar), hydrogen (H2), helium (He), and mixtures thereof. The details of the antimony containing film deposition process have been previously described herein and therefore are not repeated below in the interest of brevity.

After deposition of the antimony containing film on a suitable substrate, the exemplary method 400 (FIG. 4) may continue with a process step 402 comprising, forming an extreme ultraviolet (EUV) responsive layer over the metallic antimony containing film. For example, methods of the present disclosure can include a step of forming a EUV responsive layer overlying and directly in contact with an antimony containing film. The EUV responsive layer can comprise an organic photoresist layer, or a deposited EUV responsive layer.

Therefore, in some embodiments, the EUV responsive layer can comprise an organic EUV photoresist layer that can be formed over, or directly over, the antimony containing film employing spin-on techniques. For example, the organic EUV photoresist layer can comprise positive or negative tone extreme ultraviolet (EUV) lithography photoresist layers.

In alternative embodiments, the EUV responsive layer can comprise a deposited EUV responsive layer, such as, a EUV responsive metal-oxide containing layer deposited by deposition techniques such as chemical vapor deposition (CVD), atomic layer deposition (ALD), or PEALD, for example.

The exemplary method 400 may continue with the process step 404 comprising, irradiating select areas of the EUV responsive layer and the underlying metallic antimony containing film with EUV radiation, thereby generating a plurality of secondary electrons from the metallic antimony containing film. A portion of the secondary electrons generated from the metallic antimony containing film can further be absorbed in the overlying EUV responsive layer, thereby reducing the EUV dose that would normally be required to sufficiently expose the EUV responsive layer when not utilizing the metallic antimony containing films of the present disclosure.

In some embodiments, the substrate with both the metallic antimony containing film and the EUV responsive layer thereon, can be removed from the reaction chamber in which the PEALD deposition of the antimony containing film was performed, and subsequently transferred to a EUV patterning apparatus. In some embodiments, the transfer from the PEALD reaction chamber to the EUV patterning apparatus may be carried under controlled environment conditions to prevent contamination of the EUV responsive layer. For example, in some embodiments, the PEALD reaction chamber and the EUV patterning apparatus may form at least part of a single cluster tool, configured and arranged to perform both PEALD deposition of the antimony containing film, as well forming the EUV responsive layer and performing the EUV patterning process.

For example, the substrate with the both the metallic antimony containing film and the EUV responsive layer thereon may be placed within a EUV patterning tool and selectively exposed to EUV radiation. Both the EUV responsive layer and the metallic antimony containing film can absorb the EUV radiation, with the metallic antimony containing film also generating secondary electrons in response to the EUV radiation exposure.

Therefore, the EUV responsive layer can absorb both the EUV radiation from the EUV patterning tool as well as the secondary electrons generated by the underlying metallic antimony containing film. The combination of both stimulus (i.e., the combination of EUV radiation and secondary electrons) can considerably reduce the dose of EUV radiation that would normally be required to adequality expose the EUV responsive layer when a metallic antimony containing film is not employed as an underlayer disposed beneath the EUV responsive layer.

After sufficient exposure of the EUV responsive layer to the combination of EUV radiation and secondary electrons, the EUV responsive layer may be developed (step 406) to either remove the irradiated or the non-irradiated areas of the EUV responsive layer depending on the tone (positive or negative) of the EUV responsive layer. After development of the EUV responsive layer, the substrate may undergo further processing steps in order to fabricate a semiconductor device structure, for example.

The embodiments of the present disclosure also include structures formed by the methods disclosed herein. The structures formed by the present disclosure can comprise, a substrate, a metallic antimony containing film disposed over the substrate, and an extreme ultraviolet (EUV) responsive layer disposed over the metallic antimony containing film. In some embodiments, the metallic antimony containing film within the structure comprises a surface (i.e., the uppermost surface of said film disposed below the EUV responsive layer) which comprises, a surface composition (atomic-%) of metallic antimony (Sb) between 5 atom-% and 45 atomic-%. In alternative embodiments, the metallic antimony containing film within the structure comprises a surface (i.e., the uppermost surface of said film disposed below the EUV responsive layer) which comprises, a bulk composition (atomic-%) of metallic antimony (Sb) greater than 90 atomic-%, and a surface composition comprising, an antimony oxide ($SbO_x$).

As a non-limiting example of the structures of the present disclosure, FIG. 5 illustrates a simplified cross-sectional view of a structure 500. The structure 500 can include a substrate 502, such as, a silicon substrate, for example. Disposed on the substrate 502 is an metallic antimony containing film 504 deposited according to the embodiments of the present disclosure. In some embodiments, the metallic antimony containing film 504 is disposed directly on the substrate 502, whereas in alternative embodiments, further layers may be disposed between the metallic antimony containing film 504 and the substrate 502. The structure 500 also includes a EUV responsive layer 506 disposed over the metallic antimony containing film 504. In some embodiments, the EUV responsive layer 506 is disposed directly on the underlying metallic antimony containing film 504.

Although certain embodiments and examples have been discussed, it will be understood by those skilled in the art that the scope of the claims extend beyond the specifically disclosed embodiments to other alternative embodiments and/or uses and obvious modifications and equivalents thereof. Indeed, various modifications of the disclosure, in addition to those shown and described herein, such as alternative useful combinations of the elements described, may become apparent to those skilled in the art from the description. Such modifications and embodiments are also intended to fall within the scope of the appended claims.

In the present disclosure, where conditions and/or structures are not specified, the skilled artisan in the art can readily provide such conditions and/or structures in view of the present disclosure, as a matter of routine experimentation.

What is claimed is:

1. A method for forming and utilizing an antimony containing film, the method comprising:

seating a substrate in a reaction chamber;

depositing an antimony containing film on the substrate by performing one or more unit deposition cycles of a plasma enhanced atomic layer deposition (PEALD) process, wherein a unit deposition cycle comprises:

contacting the substrate with a vapor phase reactant comprising an antimony precursor; and contacting the substrate with one or more reactive species generated from a plasma produced from a gas comprising at least one of, argon (Ar), hydrogen ($H_2$), helium (He), and mixtures thereof;

forming an extreme ultraviolet (EUV) responsive layer over the antimony containing film;

irradiating the EUV responsive layer and the underlying antimony containing film with EUV radiation, thereby generating a plurality of secondary electrons from the antimony containing film, wherein a portion of the secondary electrons are absorbed in the EUV responsive layer; and developing the EUV responsive layer, wherein the deposited antimony containing film has a composition including metallic antimony (Sb).

2. The method of claim 1, wherein the antimony precursor comprises an alkylamine antimony precursor.

3. The method of claim 2, wherein the alkylamine antimony precursor comprises tris(dimethylamine) antimony ($Sb(NMe_2)_3$).

4. The method of claim 1, further comprising, applying an RF power of less than 50 Watts to generate the plasma.

5. The method of claim 1, further comprising, tuning the composition of the antimony containing film by adjusting at least one of a composition, flow rate, and flow rate ratio, of the gas employed in the production of the plasma.

6. The method of claim 1, wherein the plasma is produced from a gas consisting essentially of argon (Ar), and hydrogen ($H_2$).

7. The method of claim 1, wherein the deposited antimony containing film comprises, a surface composition (atomic-%) of metallic antimony (Sb) between 5 atomic-% and 45 atomic-%.

8. The method of claim 1, wherein the deposited antimony containing film comprises, a surface composition (atomic-%) of carbon (C) between 5 atomic-% and 30 atomic-%, and a surface composition of oxygen (O) between 20 atomic-% and 55 atomic-%.

9. The method of claim 1, wherein the plasma is produced from a gas consisting essentially of helium (He).

10. The method of claim 9, wherein the deposited antimony containing film comprises, a bulk composition (atomic-%) of metallic antimony (Sb) greater than 90 atomic-%, and a surface composition comprising an antimony oxide ($SbO_x$).

11. A method for forming and utilizing an antimony containing film, the method comprising:

seating a substrate in a reaction chamber;

depositing an antimony containing film on the substrate by performing one or more unit deposition cycles of a plasma enhanced atomic layer deposition (PEALD) process, wherein a unit deposition cycle comprises:

contacting the substrate with a vapor phase reactant comprising an antimony precursor; and contacting the substrate with one or more reactive species generated from a plasma produced from a gas comprising at least one of, argon (Ar), hydrogen ($H_2$), helium (He), and mixtures thereof; and heating the substrate to a deposition temperature of less than 50° C., wherein the deposited antimony containing film has a composition including metallic antimony (Sb).

12. A method for forming and utilizing a metallic antimony containing film, the method comprising:

depositing a metallic antimony containing film on a substrate by alternately and sequentially contacting the substrate with an alkylamine antimony precursor, and one or more plasma generated reactive species produced from a gas comprising, argon (Ar), hydrogen ($H_2$), helium (He), and mixtures thereof;

forming an extreme ultraviolet (EUV) responsive layer over the metallic antimony containing film;

irradiating select areas of the EUV responsive layer and the underlying metallic antimony containing film with EUV radiation thereby generating a plurality of secondary electrons from the metallic antimony containing film; and developing the EUV responsive layer.

13. The method of claim 12, wherein the alkylamine antimony precursor comprises tris(dimethylamine) antimony ($Sb(NMe_2)_3$).

14. The method of claim 12, wherein the one or more plasma generated reactive species is produced from a gas consisting essentially of argon (Ar), and hydrogen ($H_2$), and the metallic antimony containing film comprises a surface composition (atomic-%) of metallic antimony (Sb) between 5 atom-% and 45 atomic-%.

15. The method of claim 12, wherein the one or more plasma generated reactive species is produced from a gas consisting essentially of helium (He), and the metallic antimony containing film comprises a bulk composition (atomic-%) of metallic antimony (Sb) greater than 90 atomic-%, and a surface composition comprising, an antimony oxide ($SbO_x$).

* * * * *